United States Patent
Rozenblit et al.

(10) Patent No.: US 7,499,682 B2
(45) Date of Patent: Mar. 3, 2009

(54) DUAL VOLTAGE REGULATOR FOR A SUPPLY VOLTAGE CONTROLLED POWER AMPLIFIER IN A CLOSED POWER CONTROL LOOP

(75) Inventors: Dmitriy Rozenblit, Irvine, CA (US); Tirdad Sowlati, Irvine, CA (US)

(73) Assignee: Skyworks Solutions, Inc., Irvine, CA (US)

(*) Notice: Subject to any disclaimer, the term of this patent is extended or adjusted under 35 U.S.C. 154(b) by 416 days.

(21) Appl. No.: 11/137,197

(22) Filed: May 24, 2005

(65) Prior Publication Data

US 2006/0270366 A1 Nov. 30, 2006

(51) Int. Cl.
*H04B 1/04* (2006.01)
(52) U.S. Cl. .......... 455/127.3; 455/240.1; 455/260; 455/341; 375/345; 330/297; 323/351
(58) Field of Classification Search .......... 455/114.2, 455/114.3, 127.1–3, 230, 240.1, 250, 256–260, 455/341, 125.5, 194.2, 253.3, 309, 311, 361, 455/572, 574, 343.1–343.5; 375/345, 297, 375/295; 330/10, 296, 297, 199, 285, 127; 323/303, 350, 351
See application file for complete search history.

(56) References Cited

U.S. PATENT DOCUMENTS

| | | | |
|---|---|---|---|
| 4,881,023 A | 11/1989 | Perusee et al. | |
| 6,636,023 B1* | 10/2003 | Amin | 323/268 |
| 7,058,374 B2* | 6/2006 | Levesque et al. | 455/127.3 |
| 7,173,491 B2* | 2/2007 | Bocock et al. | 330/285 |
| 7,187,910 B2* | 3/2007 | Kim et al. | 455/115.3 |
| 7,250,818 B2* | 7/2007 | Ayun et al. | 330/140 |
| 2003/0034823 A1* | 2/2003 | Hiraki et al. | 327/334 |
| 2004/0072597 A1* | 4/2004 | Epperson et al. | 455/572 |
| 2004/0108900 A1* | 6/2004 | Apel | 330/285 |

* cited by examiner

*Primary Examiner*—Nhan T Le

(57) ABSTRACT

A supply voltage controlled power amplifier that comprises a power amplifier, a closed power control feedback loop configured to generate a power control signal, and a dual voltage regulator coupled to the power control feedback loop, the dual voltage regulator comprising a first regulator stage and a second regulator stage, wherein the closed power control loop minimizes noise generated by the first regulator stage.

12 Claims, 5 Drawing Sheets

DUAL VOLTAGE REGULATOR FOR A SUPPLY VOLTAGE CONTROLLED POWER AMPLIFIER IN A CLOSED POWER CONTROL LOOP

BACKGROUND OF THE INVENTION

1. Field of the Invention

This invention relates generally to power amplifier control. More particularly, the invention relates to a dual voltage regulator for a supply voltage controlled power amplifier in a closed power control loop.

2. Related Art

With the increasing availability of efficient, low cost electronic modules, portable communication devices are becoming more and more widespread. A portable communication device includes one or more power amplifiers for amplifying the power of the signal to be transmitted from the portable communication device.

With the decreasing size of portable communication devices, power efficiency is one of the most important design criteria. Reducing power consumption prolongs power source life and extends stand-by and talk time of the portable communication device. In a portable communication device that uses a non-constant amplitude output (i.e., one that modulates and amplifies both a phase component and an amplitude component), a linear power amplifier is typically used. The efficiency of the power amplifier decreases rapidly as the transmission output power decreases from a maximum level. This results in a paradox. To reduce power consumption, the power output of the power amplifier is reduced when conditions permit. Unfortunately, power amplifier efficiency rapidly decreases as the power output is reduced, thus leading to increased power consumption, and reduced power source life.

One type of power amplifier is referred to as a "supply voltage controlled" power amplifier. This power amplifier methodology varies the power output of the power amplifier by controlling the supply voltage to the power amplifier. The output power of a supply voltage controlled power amplifier (PA) is determined by a regulated voltage applied to the collector terminal of a bi-polar junction transistor (or drain terminal, if implemented as a field effect transistor (FET)) of one or more stages of the power amplifier. If implemented using bi-polar technology, this power amplifier is also referred to as a collector voltage amplifier control (COVAC) power amplifier.

To improve the efficiency of a supply voltage controlled power amplifier operating at a low power output level, a switching voltage regulator can be implemented to provide the supply voltage to the power amplifier. Unfortunately, a switching voltage regulator can inject noise and spurious components onto the transmit signal. The control bandwidth of a switching voltage regulator must also be capable of operating over the bandwidth of the transmit signal.

Therefore, it would be desirable to control the voltage applied to a supply control port of a power amplifier to minimize noise, spurious signal generation and switching transients, thereby minimizing spectral regrowth.

SUMMARY

Embodiments of the invention include a supply voltage controlled power amplifier, comprising a power amplifier, a closed power control feedback loop configured to generate a power control signal, and a dual voltage regulator coupled to the power control feedback loop, the dual voltage regulator comprising a first regulator stage and a second regulator stage, wherein the closed power control loop minimizes noise generated by the first regulator stage.

Related methods of operation are also provided. Other systems, methods, features, and advantages of the invention will be or become apparent to one with skill in the art upon examination of the following figures and detailed description. It is intended that all such additional systems, methods, features, and advantages be included within this description, be within the scope of the invention, and be protected by the accompanying claims.

BRIEF DESCRIPTION OF THE FIGURES

The invention can be better understood with reference to the following figures. The components within the figures are not necessarily to scale, emphasis instead being placed upon clearly illustrating the principles of the invention. Moreover, in the figures, like reference numerals designate corresponding parts throughout the different views.

DETAILED DESCRIPTION

Figure 1:
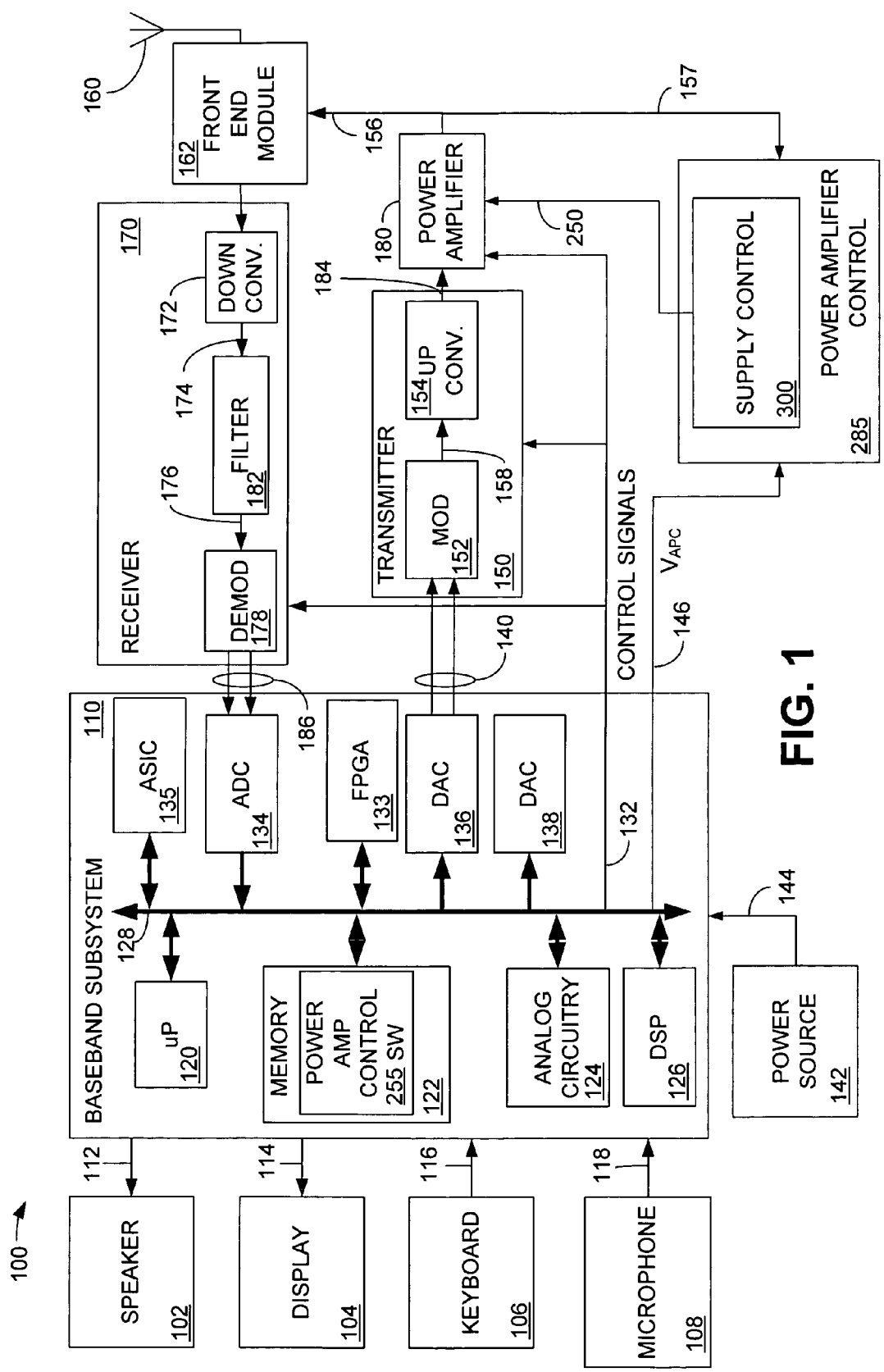
FIG. 1 is a block diagram illustrating a simplified portable transceiver including a power amplifier control element according to one embodiment of the invention.

Although described with particular reference to a portable transceiver, the power amplifier control element can be implemented in any communication device employing a closed feedback power control loop and a supply voltage controlled power amplifier.

The power amplifier control element can be implemented in hardware, software, or a combination of hardware and software. When implemented in hardware, the power amplifier control element can be implemented using specialized hardware elements and logic. When the power amplifier control element is implemented partially in software, the software portion can be used to control components in the power amplifier control element so that various operating aspects can be software-controlled. The software can be stored in a memory and executed by a suitable instruction execution system (microprocessor). The hardware implementation of the power amplifier control element can include any or a combination of the following technologies, which are all well known in the art: discrete electronic components, a discrete logic circuit(s) having logic gates for implementing logic functions upon data signals, an application specific integrated circuit having appropriate logic gates, a programmable gate array(s) (PGA), a field programmable gate array (FPGA), etc.

The software for the power amplifier control element comprises an ordered listing of executable instructions for implementing logical functions, and can be embodied in any computer-readable medium for use by or in connection with an instruction execution system, apparatus, or device, such as a computer-based system, processor-containing system, or other system that can fetch the instructions from the instruction execution system, apparatus, or device and execute the instructions.

In the context of this document, a "computer-readable medium" can be any means that can contain, store, communicate, propagate, or transport the program for use by or in connection with the instruction execution system, apparatus, or device. The computer readable medium can be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection (electronic) having one or more wires, a portable computer diskette (magnetic), a random access memory (RAM), a read-only memory (ROM), an erasable programmable read-only memory (EPROM or Flash memory) (magnetic), an optical fiber (optical), and a portable compact disc read-only memory (CDROM) (optical). Note that the computer-readable medium could even be paper or another suitable medium upon which the program is printed, as the program can be electronically captured, via for instance optical scanning of the paper or other medium, then compiled, interpreted or otherwise processed in a suitable manner if necessary, and then stored in a computer memory.

FIG. 1 is a block diagram illustrating a simplified portable transceiver 100 including an embodiment of a power amplifier control element having a supply control element. The portable transceiver 100 includes speaker 102, display 104, keyboard 106, and microphone 108, all connected to baseband subsystem 110. A power source 142, which may be a direct current (DC) battery or other power source, is also connected to the baseband subsystem 110 via connection 144 to provide power to the portable transceiver 100. In a particular embodiment, portable transceiver 100 can be, for example but not limited to, a portable telecommunication device such as a mobile cellular-type telephone. Speaker 102 and display 104 receive signals from baseband subsystem 110 via connections 112 and 114, respectively, as known to those skilled in the art. Similarly, keyboard 106 and microphone 108 supply signals to baseband subsystem 110 via connections 116 and 118, respectively. Baseband subsystem 110 includes microprocessor (μP) 120, memory 122, analog circuitry 124, and digital signal processor (DSP) 126 in communication via bus 128. Bus 128, although shown as a single bus, may be implemented using multiple busses connected as necessary among the subsystems within baseband subsystem 110.

Depending on the manner in which the power amplifier control element is implemented, the baseband subsystem 110 may also include an application specific integrated circuit (ASIC) 135 and a field programmable gate array (FPGA) 133.

Microprocessor 120 and memory 122 provide the signal timing, processing and storage functions for portable transceiver 100. Analog circuitry 124 provides the analog processing functions for the signals within baseband subsystem 110. Baseband subsystem 110 provides control signals to transmitter 150, receiver 170 power amplifier 180 and the power amplifier control element 285 such as through connection 132 for example.

The baseband subsystem 110 generates a power control signal, referred to as $V_{APC}$ which is supplied to the power amplifier control element 285 via connection 146. The signal $V_{APC}$ is generated by the baseband subsystem 110 and is generally converted to an analog control signal by one of the digital-to-analog converters (DACs) 136 or 138 to be described below. The power control signal $V_{APC}$ is illustrated as being supplied from the bus 128 to indicate that the signal may be generated in different ways as known to those skilled in the art. Generally, the power control signal, $V_{APC}$, controls the power amplifier as a function of the peak voltage of the power amplifier determined during calibration, and corresponds to power amplifier output power.

The control signals on connections 132 and 146 may originate from the DSP 126, the ASIC 135, the FPGA 133, or from microprocessor 120, and are supplied to a variety of connections within the transmitter 150, receiver 170, power amplifier 180, and the power amplifier control element 285. It should be noted that, for simplicity, only the basic components of the portable transceiver 100 are illustrated herein. The control signals provided by the baseband subsystem 110 control the various components within the portable transceiver 100. Further, the function of the transmitter 150 and the receiver 170 may be integrated into a transceiver.

If portions of the power amplifier control element 285 are implemented in software that is executed by the microprocessor 120, the memory 122 will also include power amplifier control software 255. The power amplifier control software 255 comprises one or more executable code segments that can be stored in the memory and executed in the microprocessor 120. Alternatively, the functionality of the power amplifier control software 255 can be coded into the ASIC 135 or can be executed by the FPGA 133, or another device. Because the memory 122 can be rewritable and because the FPGA 133 is reprogrammable, updates to the power amplifier control software 255 can be remotely sent to and saved in the portable transceiver 100 when implemented using either of these methodologies.

Baseband subsystem 110 also includes analog-to-digital converter (ADC) 134 and digital-to-analog converters (DACs) 136 and 138. Although DACs 136 and 138 are illustrated as two separate devices, it is understood that a single digital-to-analog converter may be used that performs the function of DACs 136 and 138. ADC 134, DAC 136 and DAC 138 also communicate with microprocessor 120, memory 122, analog circuitry 124 and DSP 126 via bus 128. DAC 136 converts the digital communication information within baseband subsystem 110 into an analog signal for transmission to a modulator 152 via connection 140. Connection 140, while shown as two directed arrows, includes the information that is to be transmitted by the transmitter 150 after conversion from the digital domain to the analog domain.

The transmitter 150 includes modulator 152, which modulates the analog information on connection 140 and provides a modulated signal via connection 158 to upconverter 154. The upconverter 154 transforms the modulated signal on connection 158 to an appropriate transmit frequency and provides the upconverted signal to a power amplifier 180 via connection 184. The power amplifier 180 amplifies the signal to an appropriate power level for the system in which the portable transceiver 100 is designed to operate.

Details of the modulator 152 and the upconverter 154 have been omitted, as they will be understood by those skilled in the art. For example, the data on connection 140 is generally formatted by the baseband subsystem 110 into in-phase (I) and quadrature (Q) components. The I and Q components may take different forms and be formatted differently depending upon the communication standard being employed. For example, when the power amplifier module is used in a constant-amplitude, phase (or frequency) modulation application such as the global system for mobile communications (GSM), the phase modulated information is provided by the modulator 152. When the power amplifier module is used in an application requiring both phase and amplitude modulation such as, for example, extended data rates for GSM evolution, referred to as EDGE, the Cartesian in-phase (I) and quadrature (Q) components of the transmit signal are converted to their polar counterparts, amplitude and phase. The phase modulation is performed by the modulator 152, while the amplitude modulation is performed by the power amplifier control element 285, where the amplitude envelope is defined by a power control voltage $V_{PC}$, which is generated by the power amplifier control element 285. The instantaneous power level of the power amplifier module 180 tracks $V_{PC}$, thus generating a transmit signal with both phase and amplitude components. This technique, known as polar modulation, eliminates the need for linear amplification by the power amplifier module, allowing the use of a more efficient saturated mode of operation while providing both phase and amplitude modulation.

The power amplifier 180 supplies the amplified signal via connection 156 to a front end module 162. The front end module comprises an antenna system interface that may include, for example, a diplexer having a filter pair that allows simultaneous passage of both transmit signals and receive signals, as known to those having ordinary skill in the art. The transmit signal is supplied from the front end module 162 to the antenna 160.

Using the power control signal, $V_{PC}$, generated by the power amplifier control element 285, the power amplifier control element 285 determines the appropriate power level at which the power amplifier 180 operates to amplify the transmit signal. The power control signal, $V_{PC}$, is also used to provide envelope, or amplitude, modulation when required by the modulation standard. The power amplifier control element 285 also includes a supply control element 300 to be described below. The power amplifier control element 285 provides a regulated supply voltage (referred to as $V_{CC}$) to the power amplifier 180 via connection 250, which determines the output of the power amplifier by controlling the supply voltage delivered to the power amplifier 180. The power amplifier control element 285 and the supply control element 300 will be described in greater detail below.

A signal received by antenna 160 will be directed from the front end module 162 to the receiver 170. The receiver 170 includes a downconverter 172, a filter 182, and a demodulator 178. If implemented using a direct conversion receiver (DCR), the downconverter 172 converts the received signal from an RF level to a baseband level (DC). Alternatively, the received RF signal may be downconverted to an intermediate frequency (IF) signal, depending on the application. The downconverted signal is sent to the filter 182 via connection 174. The filter comprises a least one filter stage to filter the received downconverted signal as known in the art.

The filtered signal is sent from the filter 182 via connection 176 to the demodulator 178. The demodulator 178 recovers the transmitted analog information and supplies a signal representing this information via connection 186 to ADC 134. ADC 134 converts these analog signals to a digital signal at baseband frequency and transfers the signal via bus 128 to DSP 126 for further processing.

Figure 2:
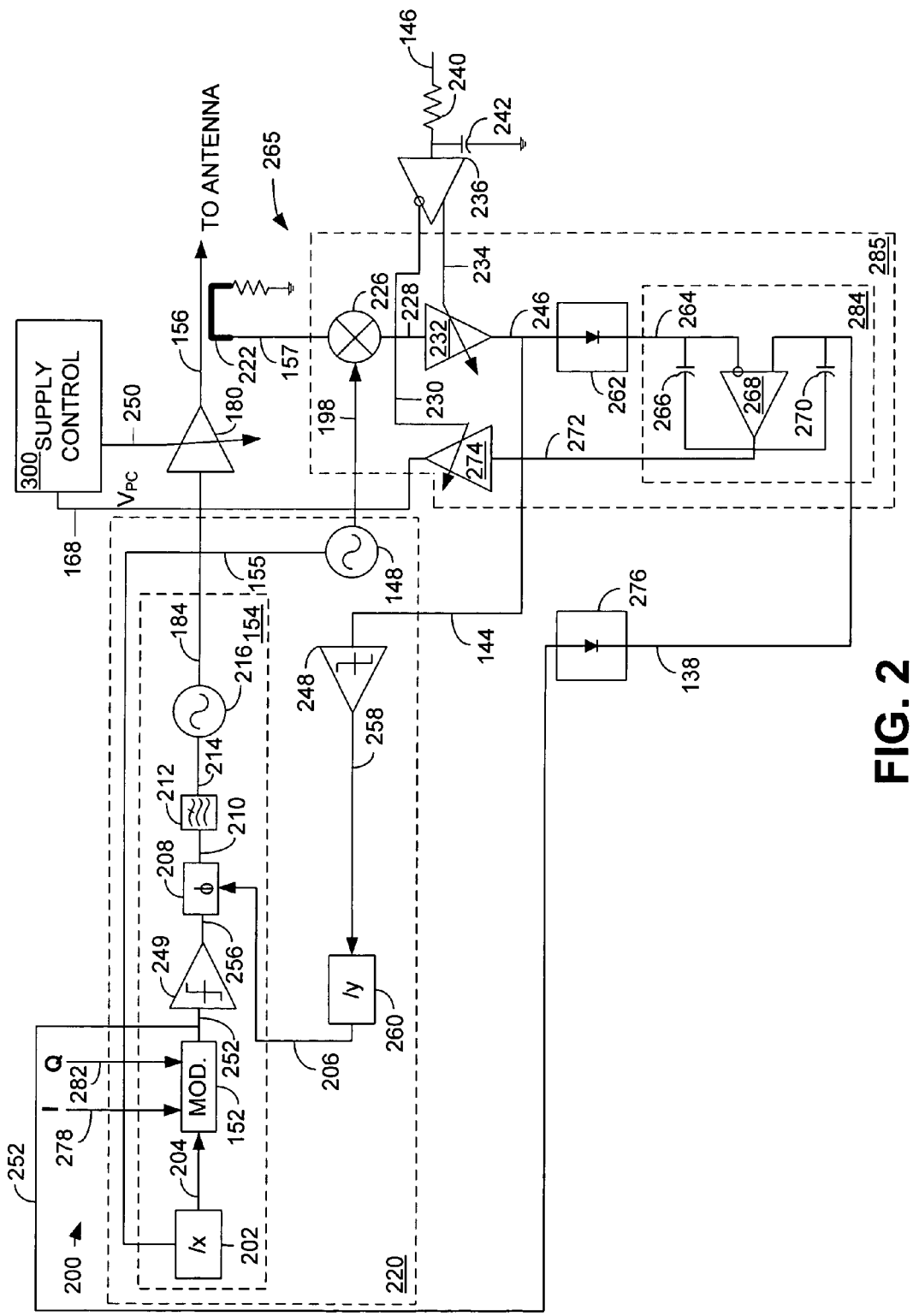
FIG. 2 is a block diagram illustrating the upconverter, power amplifier control element and the supply control element of FIG. 1.

FIG. 2 is a block diagram illustrating the upconverter 154, power amplifier control element 285 and the supply control element 300 of FIG. 1. Beginning with a description of the power amplifier control element 285, which forms a closed power control loop 265, or an "AM control loop," a portion of the output power present at the output of power amplifier 180 on connection 156 is diverted by coupler 222 via connection 157 and input to a mixer 226. The mixer 226 also receives a local oscillator (LO) signal from a synthesizer 148 via connection 198.

The mixer 226 downconverts the RF signal on connection 157 to an intermediate frequency (IF) signal on connection 228. For example, the mixer 226 takes a signal having a frequency of approximately 2 gigahertz (GHz) on connection 157 and down converts it to a frequency of approximately 100 megahertz (MHz) on connection 228 for input to variable gain element 232. The variable gain element 232 can be, for example but not limited to, a variable gain amplifier or an attenuator. In such an arrangement, the variable gain element 232 might have a dynamic range of approximately 70 decibels (dB) i.e., +35 dB/−35 dB. The variable gain element 232 receives a control signal input from the non-inverting output of an amplifier 236 via connection 234. The input to amplifier 236 is supplied via connection 146 from the baseband subsystem 110 of FIG. 1. The signal on connection 146 is the power control signal, $V_{APC}$ which is a reference voltage signal that defines the transmit power level and provides the power profile. This signal on connection 146 is supplied to a reconstruction filter, which includes resistor 240 and capacitor 242. In this manner, a reference voltage for the transmit power level and power profile is supplied via connection 234 to the control input of the variable gain element 232.

The output of the variable gain element 232 on connection 246 is an IF signal and includes modulation having both an AM component and a PM component and is called a "power measurement signal." This power measurement signal is related to the absolute output power of power amplifier 180, and includes a very small error related to the AM and PM components present in the signal. The output of variable gain element 232 on connection 246 is supplied to the input of power detector 262 and is also supplied to a limiter 248. The IF signal on connection 246 includes both an AM component and a PM component. The signal on connection 246 is supplied to a power detector 262, which provides, on connection 264, a baseband signal representing the instantaneous level of IF power present on connection 246. The output of the power detector 262 on connection 264 is supplied to the inverting input of amplifier 268.

The amplifier 268, the capacitor 266 and the capacitor 270 form a comparator 284, which provides the error signal used to control the power amplifier 180 via connection 272. The non-inverting input to the amplifier 268 is supplied via connection 138 from the output of the modulator 152 through the power detector 276. The signal on connection 138 is supplied to the non-inverting input of the amplifier 268 and contains the AM modulation developed by the modulator 152 for input to the control port 250 of the power amplifier 180.

The gain of the power amplifier control element 285 amplifies the signal on connection 272 such that the difference between the signals on connection 264 and on connection 138 input to amplifier 268 provide an error signal on connection 272 that is used to control the output of the power amplifier 180. The error signal on connection 272 is supplied to variable gain element 274, which can be similar in structure to the variable gain element 232. However, the variable gain element 274 has a function that is inverse to the function of the variable gain element 232. The control input to variable gain element 274 is supplied from the inverting output of amplifier 236. In this manner, the power amplifier control signal on connection 250 supplied to the control port of the power amplifier 180 drives the power amplifier 180 to provide the proper output on connection 156.

The level of the signal on connection 264 and the level of the signal on connection 138 should be equal. For example, if the output level of the variable gain element 232 is increased by a factor of 10, then the level of the output of power amplifier 180 should be decreased accordingly, to maintain equilibrium at the input of the amplifier 268. The output of the power amplifier 180 changes to cancel the gain change of variable gain element 232. In this manner, the amplitude of the signal on connection 264 remains equal to the amplitude of the signal on connection 138. However, this implies that the signal on connection 228 lags the signal on connection 234 with the result that the two signals will not completely cancel. In this manner, an error signal with an AM portion and a PM portion is present on connection 246. The signal on connection 246 is converted by power detector 262 from an IF signal to a baseband signal on connection 264. The signal on connection 264 is amplified by amplifier 268 and amplifier 274 and provided as input to the supply control element 300 on connection 168. The supply control element 300 controls the supply voltage to the power amplifier 180 via connection 250 so that the desired signal is achieved at the output of the power amplifier 180 on connection 156. The power amplifier control element 285 has sufficient gain so that the error signal on connection 264 can be kept small. In such a case, the gain changes of variable gain element 232 and the power amplifier 180 will substantially be the inverse of each other.

In addition to amplifying the error signal on connection 264, the amplifier 268 also compares the power measurement signal on connection 264 with a reference voltage signal including an AM portion on connection 138, supplied by the modulator 152. The DC voltage level on connection 138 affects the desired static output power for the power amplifier 268, irrespective of AM modulation. The amplifier 268 compares the signal level on connection 264 with the signal level on connection 138 and then amplifies the difference, thus providing a power control signal on connection 272. The comparator 284 functions as an integrator, which is also a low pass filter. Alternatively, the AM portion of the signal may be introduced to the power amplifier control element 285 in other ways, such as, for example, through the variable gain element 232.

The power control signal on connection 272 drives the variable gain amplifier 274, which corrects for the effect that the variable gain element 232 has on the transfer function of the power amplifier control element 285. The variable gains of the variable gain element 232 and variable gain element 274 are complimentary. Because the power measurement signal is present on connection 264 and the AM error signal is present on connection 138, the amplifier 268 provides a dual function; (1) it amplifies the AM error signal on connection 138 so as to modulate the power output of power amplifier 180 via connection 250 to have the correct amount of AM; and (2) it performs the average power comparison and amplifies the result, thus providing a control signal on connection 272 that drives the variable gain amplifier 274. The variable gain amplifier 274 provides a voltage signal, $V_{PC}$, on connection 168, which includes the AM portion and which drives the supply control element 300 to control the supply voltage delivered to the power amplifier 180. The supply control element 285 drives the power amplifier 180 to the correct average power output. In this manner, power output is controlled and the desired AM portion of the signal is supplied to the control input 250 of power amplifier 180 and made present on the power amplifier output on connection 156. The mixer 226, variable gain element 232, power detector 262, amplifier 268 and the variable gain element 274 provide a continuous closed power control loop 265 to control the power output of power amplifier 180, while allowing for the introduction of the AM portion of the transmit signal via connection 138.

At all times, the closed power control loop 265 allows the correction of any phase shift caused by power amplifier 180. The phase locked loop 220 now includes a closed power control feedback loop for looping back the output of power amplifier 180 to the input of phase/frequency detector 208. Any unwanted phase shift generated by the power amplifier 180 will be corrected by the phase locked loop 220. The output of variable gain element 232 passes any phase distortion present via connection 246 to limiter 248 for correction by the phase locked loop 220. As such, the phase of the output of power amplifier 180 is forced to follow the phase of the LO signal on connection 155.

To remove the AM from the output of variable gain element 232, the variable gain element 232 is connected via connection 246 and connection 144 to the input of limiter 248. The limiter 248 develops a local oscillator signal containing only a PM component on connection 258. This LO signal is supplied via connection 258 to a divider 260, which divides the signal on connection 258 by a number, "y." The number "y" is chosen so as to minimize the design complexity of the synthesizer 148. The output of the divider 260 is supplied to the phase/frequency detector 208.

An unmodulated input signal from synthesizer 148 is supplied to the divider 202 via connection 155. The unmodulated input signal is frequency divided by a number "x" to provide a signal having an appropriate frequency on connection 204. The number "x" is chosen to minimize the design complexity of the synthesizer 148 and can be, for example, but not limited to, chosen to convert the output of the synthesizer 148 to a frequency of 100 MHz. The output of the divider on connection 204 is supplied to the modulator 152. In addition, the baseband I and Q information signals are supplied via connections 278 and 282, respectively, to the modulator 152. The I and Q baseband information signal interface is understood by those having ordinary skill in the art. As a result of the operation of the modulator 152, the output on connection 252 is an intermediate frequency signal including an AM component in the form of an AM reference signal and a small PM error signal. The output of modulator 152 is supplied via connection 252 to power detector 276. The output of power detector 276 also includes the AM portion of the desired transmit signal. The signal provided on connection 138 is a reference signal for input to the power amplifier control element 285. Because the power amplifier control element 285 has limited bandwidth, the rate at which the amplitude modulation occurs on connection 138 is preferably within the bandwidth of the power control feedback loop 265.

The components within the phase locked loop 220 provide gain for the comparison of the PM on connection 258 and the modulator connections 278 and 282, thus providing a phase error output of the modulator 152 on connection 252. This phase error signal is then supplied to limiter 248, which outputs a signal on connection 258 containing the small PM phase error component.

The error signal output of modulator 152 on connection 252 containing the phase error, will get smaller and smaller as the gain of the phase locked loop 220 increases. However, there will always be some error signal present, thus enabling the phase locked loop 220 to achieve phase lock. It should be noted that even when the power amplifier 180 is not operating, there will always be some small leakage through the power amplifier 180 onto connection 156. This small leakage is sufficient to provide a feedback signal through the variable gain element 232 and into the phase locked loop 220 such that the phase locked loop 220 can be locked using just the leakage output of power amplifier 180. In this manner, a single feedback loop can be used to continuously control the output power of power amplifier 180 from the time that the amplifier is off through the time when the amplifier 180 is providing full output power.

The output of the modulator 152 is supplied via connection 252 to a limiter 249. The limiter 249 cancels the AM component present on connection 252, thereby preventing any AM-to-PM conversion in the phase/frequency detector 208. The phase/frequency detector 208 receives an unmodulated input signal from the limiter 249. The phase/frequency detector 208 also receives the output of divider 260 via connection 206. The phase/frequency detector 208 detects any phase difference between the signal on connection 256 and the signal on connection 206 and places a signal on connection 210 that has an amplitude proportional to the difference. When the phase difference reaches 360°, the output of phase/frequency detector 208 on connection 210 will become proportional to the frequency difference between the signals on connections 256 and 206.

The output of phase/frequency detector 208 on connection 210 is a digital signal having a value of either a 0 or a 1 with a very small transition time between the two output states. This signal on connection 210 is supplied to low-pass filter 212, which integrates the signal on connection 210 and places a DC signal on connection 214 that controls the frequency of the transmit voltage control oscillator (TX VCO) 216. The output of TX VCO 216 is supplied via connection 184 directly to the power amplifier 180. In this manner, the synthesizer 148, limiter 248, modulator 152, limiter 256, divider 260, divider 202, phase/frequency detector 208, low-pass filter 212 and TX VCO 216 form a phase locked loop (PLL) 220, which is used to determine the transmit frequency on connection 184. Alternatively, the modulator 152 may reside outside of the PLL 220. When the PLL 220 is settled, or "locked," then the two signals entering the phase/frequency detector 208 on connections 256 and 206 have substantially the same phase and frequency, and the output of the phase/frequency detector 208 on connection 210 goes to zero. The output of the integrating low-pass filter 212 on connection 214 stabilizes, resulting in a fixed frequency out of TX VCO 216. For example, the synthesizer 148 and the mixer 226 ensure that the frequency of the signal output from the TX VCO 216 on connection 184 tracks the sum of the frequencies of the local oscillator signal supplied by synthesizer 148 and the IF frequency on connection 206.

When the phase locked loop 220 is locked, the phase of the signal on connection 256 and the phase of the signal on connection 206 will be substantially equal. Because the amount of PM on connection 206 should be very small, the gain in the phase locked loop 220 has to be sufficiently high to amplify the error signal on connection 206 to a level at which the phase/frequency detector 208 can make a comparison. By using the modulator 152 to impose the I and Q information signals on the signal on connection 204 in a direction opposite from which it is desirable for the phase of the TX VCO to move, and because it is desirable for the phase locked loop 220 to remain locked, the phase of the signal output from the TX VCO 216 on connection 184 will move opposite that of the phase imposed by the modulator 152. In this manner, the PM error signal present on connection 206 is minimized by the very high sensitivity, of the order of many MHz per volt, of the TX VCO 216.

Because the power amplifier control element 285 is a closed loop for AM signals at connection 138, it is possible to use a non-linear, and therefore highly efficient, power amplifier 180. Furthermore, the undesirable and detrimental AM-to-PM conversion, which occurs due to the amplitude dependence of an amplifier's phase shift, is rectified by the power amplifier 180 being included within the phase locked loop 220. By separating the AM and the PM modulation and by providing closed loop control for both the AM and PM modulation, a non-linear, and therefore highly efficient power amplifier can be used. The supply control element 300, which will be described in detail below, provides the AM portion of the signal and controls the output of the power amplifier 180 in such a way as to minimize low power inefficiency.

Figure 3:
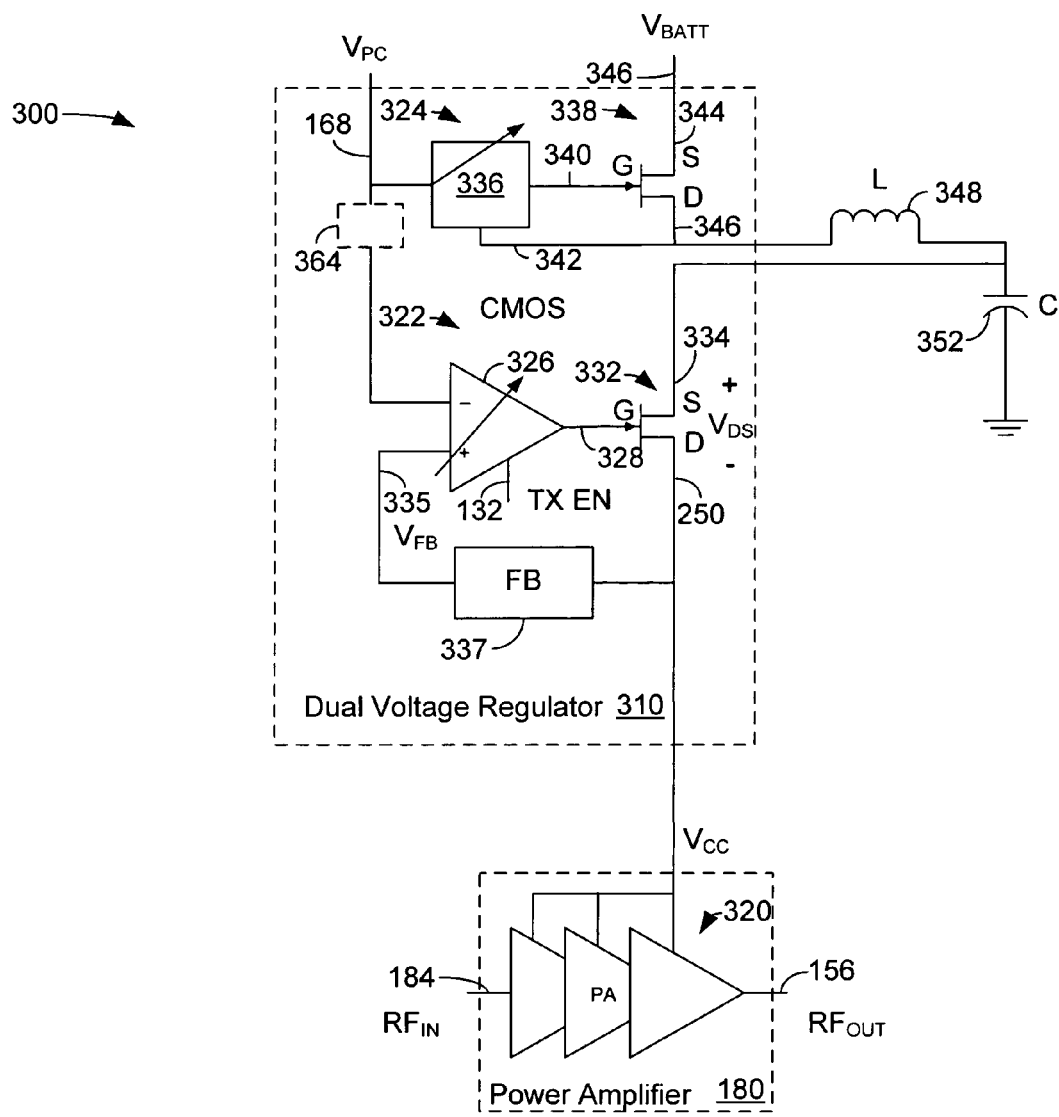
FIG. 3 is a block diagram illustrating an embodiment of the supply control element of FIG. 2.
Figure 3:
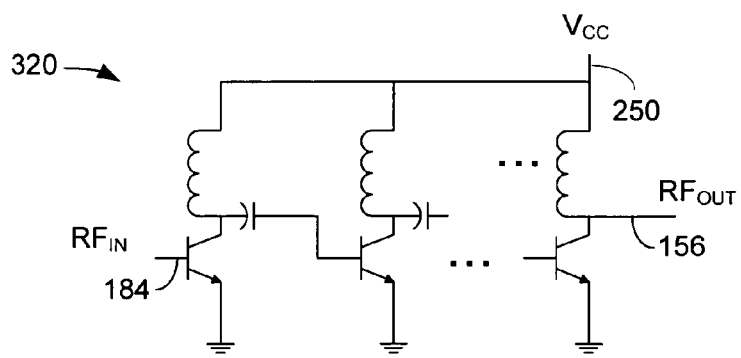

FIG. 3 is a block diagram illustrating an embodiment of the supply control element 300 of FIG. 2. In this embodiment, the supply control element 300 is implemented as a dual voltage regulator 310. The dual voltage regulator is located within the closed power control loop 265 created by the power amplifier control element 285. The power amplifier 180 comprises, in this example, multiple stages of power amplifier modules, indicated collectively at 320. In this example, the power amplifier stages are arranged in series. A radio frequency input signal ($RF_{IN}$) is supplied via connection 184 and the radio frequency output signal ($RF_{OUT}$) is supplied via connection 156. The signal on connection 156 is an amplified version of the signal on connection 184. In accordance with an embodiment of the invention, the level of the input signal on connection 184 is not proportionally related to the level of the output signal on connection 156. In this embodiment, the power amplifier 180 is controlled by a reference signal, referred to as $V_{CC}$ supplied from the dual voltage regulator 310 on connection 250.

The dual voltage regulator 310 comprises a linear voltage regulator 322 and a switching voltage regulator 324. In one embodiment, the linear voltage regulator 322 and the switching voltage regulator 324 may reside on the same die and may also reside on the same die or on a different die as the power amplifier 180. The power amplifier modules 320 within the power amplifier 180 are operated in a saturated mode, where the output power is not linearly related to the input power. When properly biased for saturated operation, the output power at connection 156 is related to the $V_{CC}$ signal on connection 250. In one embodiment, the power amplifier modules may be implemented as a series of bi-polar transistors in which the supply voltage control signal on connection is delivered to the collector terminal of each bi-polar amplifier module in the power amplifier 180. This is one possible implementation and is shown in FIG. 3 for example only.

The linear voltage regulator 322 includes an operational amplifier (op amp) 326, an n-type field effect transistor (NFET) 332 and a feedback connection 335. The feedback connection generally includes a transfer function, H, of the power control signal, $V_{PC}$. Since the power amplifier control element 285 (FIG. 2) is used to provide amplitude modulation, the bandwidth of the dual voltage regulator 300 is sufficient to support the envelope bandwidth of the modulated signal. The inverting input of the operational amplifier 326 is coupled to the power control signal, $V_{PC}$, generated by the power amplifier control element 285 (FIG. 2). Optionally, a level shifter 364 may be implemented between connection 168 and the input to the linear voltage regulator 322 to alter the level of the $V_{PC}$ signal supplied to the linear voltage regulator 322. The non-inverting input of the operational amplifier 326 receives the output ($V_{FB}$) of a feedback network 337 via connection 335. The output of the operational amplifier 326 is supplied via connection 328 to the gate terminal of the transistor 332. The source terminal 334 of the transistor 332 is coupled to a capacitance 352. The drain terminal of the transistor 332 provides the output, $V_{CC}$, of the dual voltage regulator 300 on connection 250 to the collector terminal of the power amplifier 180. The output of the drain terminal 250 is also supplied as input to the feedback path 335.

In accordance with an embodiment of the invention, the dual voltage regulator 310 includes a switching voltage regulator 324. The switching voltage regulator 324 includes a regulator component 336 and a transistor 338. In this embodiment, the transistor 338 is shown as a p-type field effect transistor (PFET). The regulator component 336 receives the $V_{PC}$ signal via connection 168 and supplies an output to the gate terminal 340 of the transistor 338. The source terminal 344 of the transistor 338 is connected to battery voltage, $V_{BATT}$ on connection 346. The drain terminal 346 is coupled to a load inductance 348 and a load capacitance 352.

The source terminal 334 of the transistor 332 is also coupled to the load inductance 348 and to the load capacitance 352. The switching voltage regulator 324 operates at a high efficiency to reduce the battery voltage from a value of, in this embodiment, approximately 4 volts (V) to a value of approximately 0.8V. The high and low voltage values could be different than stated here and are typically chosen by design. Then, the linear voltage regulator 322 reduces the output voltage of the switching voltage regulator 324 to the proper level that the closed power control loop 265 dictates. In this embodiment, the linear voltage regulator 322 reduces the voltage to approximately 0.5V on connection 334, which is output on connection 250 to control the power amplifier 180. The $V_{CC}$ signal on connection 250 is supplied to the supply terminal of one or more of the power amplifier modules 320. If the power amplifier 180 is implemented using bi-polar technology in a supply voltage controlled arrangement, the power amplifier 180 is referred to as a "collector voltage controlled" power supply.

However, the switching voltage regulator 324 is relatively difficult to implement in systems that have a high operating bandwidth requirement, such as the power amplifier control element 285 and the closed power control loop 265. The switching voltage regulator 324 has a control bandwidth of about 100 kilohertz (kHz), which is a reasonable bandwidth for a switching voltage regulator having a switching frequency of about 500 kHz. The linear voltage regulator 322 has a bandwidth of approximately 5 MHz to 10 MHz and the closed power control loop 265 has a bandwidth of approximately 1.8 Mhz. The control port (connection 168) of the switching voltage regulator 324 is connected directly to the power control signal, $V_{PC}$, via connection 168. As mentioned above, an additional voltage shift is provided by the level shifter 364 at the input of the switching voltage regulator 324. The level shifter 364 provides a voltage offset between the switching voltage regulator 324 and the linear voltage regulator 322.

When implemented as shown in FIG. 3, the components in the transmit chain of the portable communication device 100 operate the same as if the dual voltage regulator 310 did not include the switching voltage regulator 324. The output of the switching voltage regulator 324 on connection 346 coarsely follows the envelope variation due to the amplitude modulation, thus minimizing the voltage drop across the linear voltage regulator 322. Accurate amplitude modulation is delivered to the power amplifier 180 via the supply voltage control signal over connection 250. Essentially, the switching voltage regulator 324 minimizes the voltage headroom desired for accurate operation of the linear voltage regulator 322. The switching voltage regulator 324 provides a coarse voltage adjustment, the linear voltage regulator 322 provides a fine voltage adjustment, and the power amplifier control element 285 and closed power control loop 265 provide additional fine voltage adjustment. The switching voltage regulator 324 and the linear voltage regulator 322 are dynamically adjustable based on the value of the power control signal $V_{PC}$ supplied by the power amplifier control element 285.

The switching voltage regulator 324 has a relatively narrow bandwidth while the linear voltage regulator 322 has a relatively wide bandwidth. Therefore, while the switching voltage regulator 324 coarsely follows the input signal $V_{PC}$, it cannot replicate the high frequency variation in the input signal. The linear voltage regulator 322 has a much wider bandwidth than the bandwidth of the variation in the input signal, $V_{PC}$, and can therefore follow variations in the input signal, $V_{PC}$. The bandwidth of the switching voltage regulator 324 is intentionally chosen to be small to reduce any voltage ripple in its output. The bandwidth of the linear voltage regulator 322 is intentionally chosen to be large to both filter out the noise and ripple in the output of the switching voltage regulator 324, and to be able to follow the input signal, $V_{PC}$. The reduction of the noise and the ripple in the output of the switching voltage regulator 324 and the linear voltage regulator 322 is done by the closed AM power control performed by the power amplifier control element 285.

Due to the closed loop operation of the power amplifier control element 285 control of the switching voltage regulator 324 and the linear voltage regulator 322 is generated within the closed loop architecture. Thus, the control of the dual voltage regulator 310 is more accurate than if implemented using an open loop power control system. In addition, implementing the dual voltage regulator 310 in a closed power control loop allows the dual voltage regulator to tolerate wide parameter variations, and it provides the error correction within its loop bandwidth, including the noise from the switching voltage regulator 324 and the linear voltage regulator 322, and any residual products of the switching voltage regulator 324 not compensated by the linear voltage regulator 322.

Figure 4:
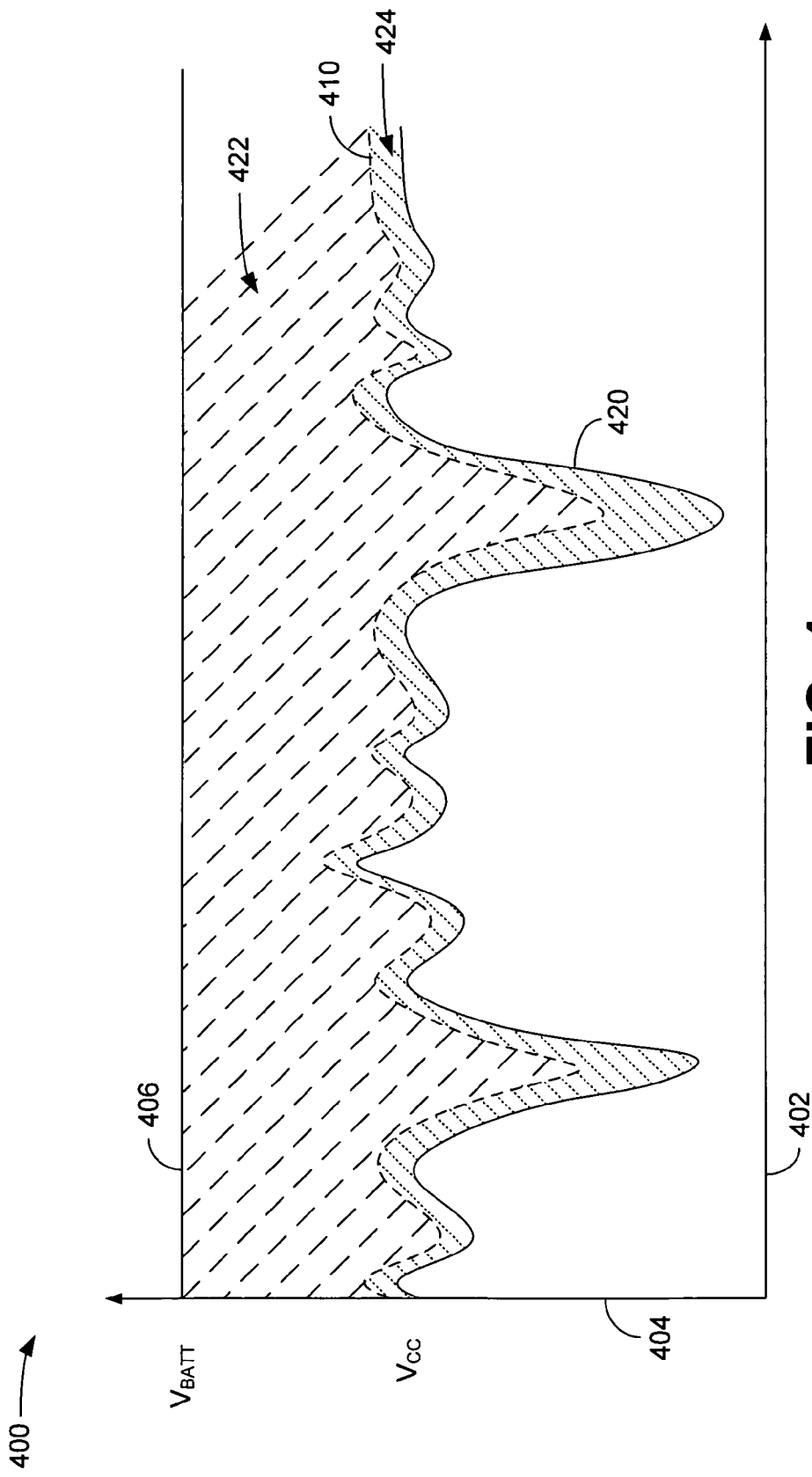
FIG. 4 is a diagrammatic view illustrating an exemplary transmit envelope 400 illustrating the operation of the dual voltage regulator.

FIG. 4 is a diagrammatic view illustrating an exemplary transmit envelope 400 illustrating the operation of the dual voltage regulator 310. The horizontal axis 402 represents time and the vertical axis 404 represents the voltage on the control terminal of the power amplifier 180. The curve 406 represents battery voltage. The curve 410 illustrates the operation of the switching voltage regulator 324, whereby the switching voltage regulator 324 performs a majority of the voltage regulation illustrated by the area indicated at 422. In this example, a majority of the voltage regulation is performed by the switching voltage regulator 324, which is significantly more efficient than the linear voltage regulator 322. The curve 420 illustrates the operation of the linear voltage regulator 322, and illustrates the fine voltage adjustment performed by the linear voltage regulator 322. The area 424 indicates the voltage regulation performed by the linear voltage regulator 422.

Figure 5:
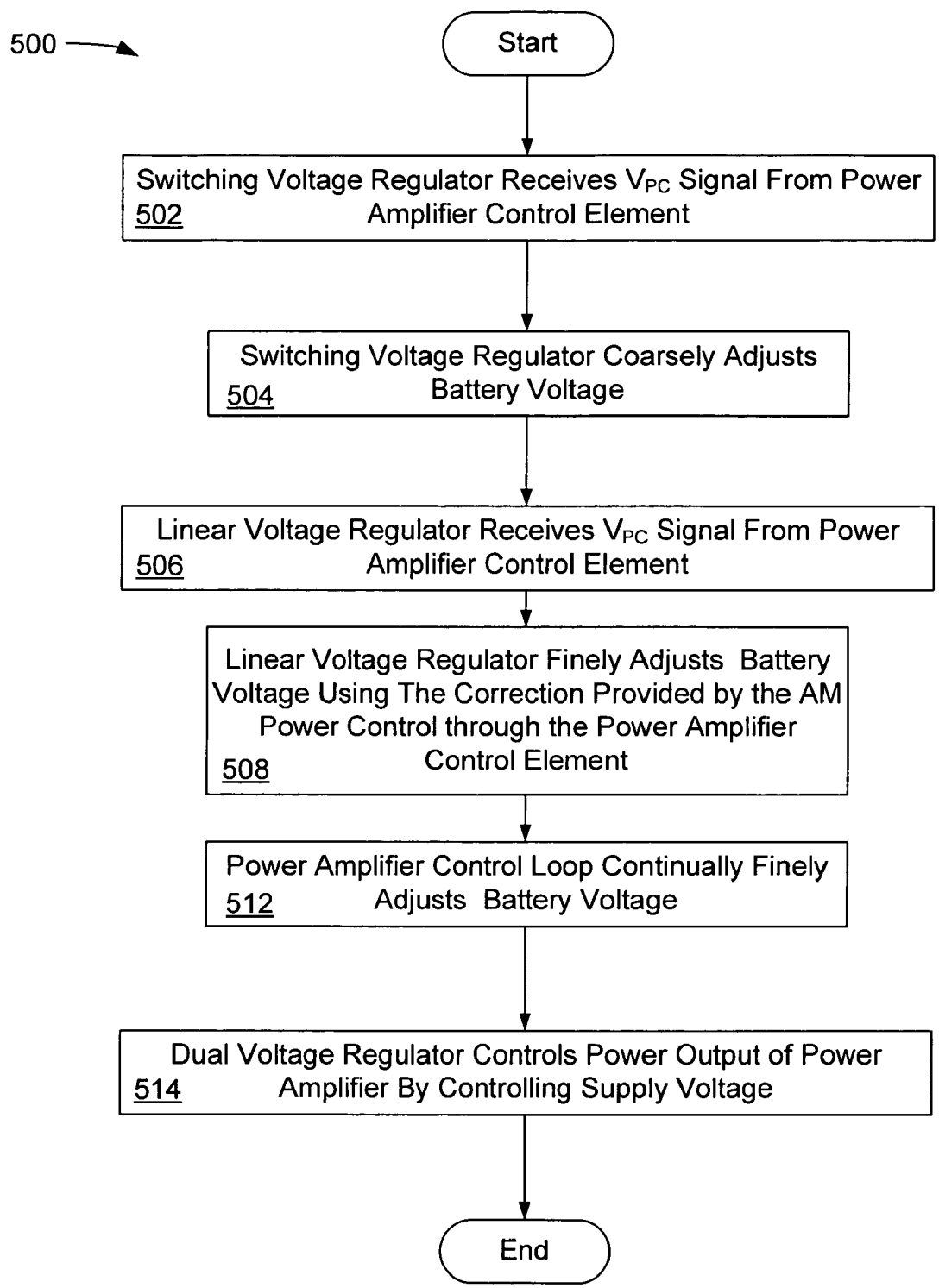
FIG. 5 is a flow chart illustrating the operation of an embodiment of the power amplifier control element.

FIG. 5 is a flow chart illustrating the operation of an embodiment of the power amplifier control element. The blocks in the flowchart can be performed in the order shown, out of the order shown, or can be performed in parallel. In block 502, the switching voltage regulator 324 receives the $V_{PC}$ signal from the power amplifier control element 285. In block 504, the switching voltage regulator 324 coarsely adjusts the battery voltage. An example of the voltage regulation provided by the switching voltage regulator 324 is regulating the battery voltage from approximately 4V to approximately 0.8V and is indicated in FIG. 4 as the area 422. The switching voltage regulator provides this regulation at an approximate 90% efficiency.

In block 506, the linear voltage regulator 322 receives the $V_{PC}$ signal from the power amplifier control element 285. In block 508, the linear voltage regulator 322 finely adjusts the battery voltage. An example of the voltage regulation provided by the linear voltage regulator 322 is regulating the output of the switching voltage regulator 324 from approximately 0.8V to approximately 0.5V and is indicated in FIG. 4 as the area 424. The linear voltage regulator 322 provides this regulation at an efficiency lower than the efficiency of the switching voltage regulator 324, but because the regulation provided by the linear voltage regulator 322 is substantially less than the regulation provided by the switching voltage regulator 324, the overall efficiency of the dual voltage regulator 310 provides efficient voltage regulation. The linear voltage regulator 322 reduces the noise and the ripple in the output of the switching voltage regulator 324 through the correction provided by the AM power control through the power amplifier control element 285.

In block 512, the operation of the power amplifier control element 285 in the closed power control loop 265 continually fine tunes the output of the dual voltage regulator 310 by providing a continually adjusted $V_{PC}$ power control signal.

In block 514, the dual voltage regulator 310 controls the output power of the power amplifier 180 by controlling the supply voltage, $V_{CC}$ delivered to the power amplifier 180.

While various embodiments of the invention have been described, it will be apparent to those of ordinary skill in the art that many more embodiments and implementations are possible that are within the scope of this invention. Accordingly, the invention is not to be restricted except in light of the attached claims and their equivalents.

What is claimed is:

1. A method for dynamically controlling the power output of a power amplifier, comprising:
   providing a radio frequency (RF) signal to a power amplifier;
   generating a power control signal in a closed power control loop;
   providing the power control signal to a switching voltage regulator and a linear voltage regulator;
   using the power control signal to dynamically control the switching voltage regulator and the linear voltage regular, wherein the power control signal provides fine control of the output of the linear voltage regulator;
   filtering voltage ripple at an output of the switching voltage regulator;
   controlling the filtering using the power control signal, wherein the closed power control loop minimizes noise generated by the switching voltage regulator.

2. The method of claim 1, wherein the power control signal provides coarse control of the output of the switching voltage regulator.

3. The method of claim 1, further comprising locating the switching voltage regulator and the linear voltage regulator in the closed power control feedback loop.

4. A supply voltage controlled power amplifier, comprising:
   a power amplifier;
   a closed power control feedback loop configured to generate a power control signal; and
   a dual voltage regulator coupled to the power control feedback loop, the dual voltage regulator comprising a switching voltage regulator and a linear voltage regulator which are dynamically controlled by the power control signal, wherein the closed power control loop minimizes noise generated by the switching voltage regulator, the power control signal provides fine control of an output of the linear voltage regular, and the linear voltage regulator filters voltage ripple at an output of the switching voltage regulator based on the power control signal.

5. The supply voltage controlled power amplifier of claim 4, wherein the switching voltage regulator has a narrow bandwidth.

6. The supply voltage controlled power amplifier of claim 5, wherein the linear voltage regulator has a wide bandwidth.

7. The supply voltage controlled power amplifier of claim 4, wherein the switching voltage regulator and the linear voltage regulator are located in the closed power control feedback loop.

8. A portable transceiver, comprising:
   a transceiver for transmitting and receiving a radio frequency (RF) signal;
   a power amplifier;
   a closed power control feedback loop configured to generate a power control signal; and
   a dual voltage regulator coupled to the power control feedback loop, the dual voltage regulator comprising a switching voltage regulator and a linear voltage regulator which are dynamically controlled by the power control signal, wherein the closed power control loop minimizes noise generated by the switching voltage regulator, the power control signal provides fine control of an output of the linear voltage regulator, and wherein the linear voltage regulator filters voltage ripple at an output of the switching voltage regulator based on the power control signal.

9. The portable transceiver of claim 8, wherein the switching voltage regulator has a narrow bandwidth.

10. The portable transceiver of claim 8, wherein the linear voltage regulator has a wide bandwidth.

11. The portable transceiver of claim 8, wherein the switching voltage regulator and the linear voltage regulator are located in the closed power control feedback loop.

12. A portable transceiver, comprising:
   means for transmitting and receiving a radio frequency (RF) signal;
   amplifying means for amplifying the RF signal;
   means for generating a power control signal; and
   regulating means for regulating an output of the amplifying means, wherein the means for generating a power control signal minimizes noise generated by the regulator means, and wherein the regulator means comprises switching regulator means and linear regulator means, wherein the switching regulator means coarsely adjusts a voltage signal, the linear regulator means finely adjusts the voltage signal, the means for generating the power control signal finely adjusts the switching regulator means and the linear regulator means, and the linear regulator means filters voltage ripple at an output of the switching regulator means based on the power control signal.

* * * * *